(12) United States Patent
Liu et al.

(10) Patent No.: US 8,611,137 B2
(45) Date of Patent: Dec. 17, 2013

(54) MEMORY ELEMENTS WITH RELAY DEVICES

(75) Inventors: Lin-Shih Liu, Fremont, CA (US); Mark T. Chan, San Jose, CA (US); Yanzhong Xu, Santa Clara, CA (US); Irfan Rahim, Milpitas, CA (US); Jeffrey T. Watt, Palo Alto, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 13/304,226

(22) Filed: Nov. 23, 2011

(65) Prior Publication Data
US 2013/0127494 A1 May 23, 2013

(51) Int. Cl.
*G11C 11/00* (2006.01)

(52) U.S. Cl.
USPC ........... 365/156; 365/151; 365/154; 977/943; 977/932; 326/40

(58) Field of Classification Search
USPC .................. 326/38–41; 365/51, 63, 154, 165, 365/185.08, 230.08
See application file for complete search history.

(56) References Cited

U.S. PATENT DOCUMENTS

| | | | |
|---|---|---|---|
| 3,348,206 A | 10/1967 | Dannatt et al. | |
| 4,949,061 A | 8/1990 | Kirma | |
| 5,751,627 A * | 5/1998 | Ooishi | 365/145 |
| 7,301,802 B2 | 11/2007 | Bertin et al. | |
| 7,495,952 B2 | 2/2009 | Lal et al. | |
| 7,569,880 B2 | 8/2009 | Bertin et al. | |
| 7,583,526 B2 * | 9/2009 | Bertin et al. | 365/151 |
| 7,612,270 B1 * | 11/2009 | Zhu | 257/314 |
| 7,911,826 B1 * | 3/2011 | Liu et al. | 365/154 |
| 8,012,785 B2 * | 9/2011 | Liang et al. | 438/50 |
| 8,081,503 B1 * | 12/2011 | Nguyen et al. | 365/154 |
| 8,154,912 B2 * | 4/2012 | Pedersen | 365/156 |
| 8,289,755 B1 * | 10/2012 | Rahim et al. | 365/156 |
| 2010/0273286 A1 * | 10/2010 | Liang et al. | 438/50 |
| 2011/0094861 A1 * | 4/2011 | Feng et al. | 200/181 |
| 2011/0163397 A1 * | 7/2011 | Detor et al. | 257/415 |

OTHER PUBLICATIONS

Gupta et al., "NEM Relay Memory Design", Electrical Engineering and Computer Sciences, University of California at Berkeley, Technical Report No. UCB/EECS-2009-83, May 21, 2009.

* cited by examiner

*Primary Examiner* — Vibol Tan
(74) *Attorney, Agent, or Firm* — Treyz Law Group; Jason Tsai

(57) ABSTRACT

Integrated circuits with memory elements are provided. An integrated circuit may include logic circuitry formed in a first portion having complementary metal-oxide-semiconductor (CMOS) devices and may include at least a portion of the memory elements and associated memory circuitry formed in a second portion having nano-electromechanical (NEM) relay devices. The NEM and CMOS devices may be interconnected through vias in a dielectric stack. Devices in the first and second portions may receive respective power supply voltages. In one suitable arrangement, the memory elements may include two relay switches that provide nonvolatile storage characteristics and soft error upset (SEU) immunity. In another suitable arrangement, the memory elements may include first and second cross-coupled inverting circuits. The first inverting circuit may include relay switches, whereas the second inverting circuit includes only CMOS transistors. Memory elements configured in this way may be used to provide volatile storage characteristics and SEU immunity.

22 Claims, 9 Drawing Sheets

|          | LOAD "1" | LOAD "0" | HOLD |
|----------|----------|----------|------|
| $V_{G1}$ | 1.0      | -1.0     | 0    |
| $V_{B1}$ | -1.0     | 1.0      | 0    |
| $V_{G2}$ | -1.0     | 1.0      | 0    |
| $V_{B2}$ | 1.0      | -1.0     | 0    |

FIG. 6

MEMORY ELEMENTS WITH RELAY DEVICES

BACKGROUND

Integrated circuits often contain volatile memory elements. Typical volatile memory elements are based on cross-coupled inverters (latches). A volatile memory element retains data only so long as the integrated circuit is powered. In the event of power loss, the data in the volatile memory element is lost. For example, static random-access memory (SRAM) chips contain SRAM cells, which are a type of volatile memory element. Volatile memory elements are also used in programmable logic device integrated circuits.

Volatile memory elements are subject to a phenomenon known as soft error upset. Soft error upset events are caused by cosmic rays and radioactive impurities embedded in integrated circuits and their packages. Cosmic rays and radioactive impurities generate high-energy atomic particles such as neutrons and alpha particles. The memory elements contain transistors and other components that are formed from a patterned silicon substrate. When an atomic particle strikes the silicon in the memory element, electron-hole pairs are generated. The electron-hole pairs create a conduction path that can cause a charged node in the memory element to discharge and the state of the memory element to flip. If, for example, a "1" was stored in the memory element, a soft error upset event could cause the "1" to change to a "0."

Upset events in an integrated circuit corrupt the data stored in the memory elements and can have serious repercussions for system performance. In certain system applications such as remote installations of telecommunications equipment, it is extremely burdensome to repair faulty equipment. Unless integrated circuits demonstrate good immunity to soft error upset events, they will be unsuitable for these types of applications.

SUMMARY

Integrated circuits with memory cells are provided. Integrated circuits may include control circuitry operable to control a memory cell array. The control circuitry may include circuitry such as addressing circuitry, data register circuitry, write driver circuitry, read sensing circuitry, and other control circuitry.

An integrated circuit may include a first portion having devices formed using nano-electromechanical (NEM) relay technology and a second portion having devices formed using complementary metal-oxide-semiconductor (CMOS) technology. The NEM devices may be formed on top of the CMOS devices and may be coupled to the CMOS circuitry through vias in a dielectric stack that is interposed between the NEM devices and the CMOS circuitry. At least a portion of the memory circuitry may be formed in the first upper portion, whereas non-memory related circuitry such as logic circuits and other processing circuitry may be formed in the second lower portion. Circuitry in the first and second portions of the integrated circuit may receive respective power supply levels.

In one suitable embodiment of the present invention, a memory cell may include first and second nonvolatile relay switches coupled in series between a pair of power supply lines. The first and second relay switches may be connected at an intermediate node on which a single bit of data may be latched. The first and second nonvolatile relay switches may each include gate and bulk terminals and may retain their state even if the gate-to-bulk voltage is low. The gate and bulk voltages may be individually controlled using control circuitry to load a "1" or "0" into the memory cell. A memory cell configured in this way may exhibit nonvolatile behavior, soft error upset immunity, and zero standby current.

In another suitable embodiment of the present invention, a memory cell may include first and second cross-coupled inverting circuits. The first inverting circuit may include at least one relay switch coupled in series with a second relay switch or an n-channel transistor between a first pair of power supply lines, whereas the second inverting circuit may include two CMOS transistors coupled in series between a second pair of power supply lines. The first inverting circuit may have an output that serves as a first data storage node for the memory cell, whereas the second inverting circuit may have an output that serves as a second data storage nod for the memory cell. At least one access transistor may be coupled between a data line and at least one of the first and second data storage nodes. The access transistor may be used to read data from and write data into the memory cell. A memory cell configured in this way may exhibit soft error upset immunity and reduced power consumption.

Further features of the present invention, its nature and various advantages will be more apparent from the accompanying drawings and the following detailed description.

BRIEF DESCRIPTION OF THE DRAWINGS

FIG. 6 is a table of illustrative voltage biasing values for operating the relay switch of FIG. 3 in accordance with an embodiment of the present invention.

DETAILED DESCRIPTION

Embodiments of the present invention relate to integrated circuit memory elements that are resistant to soft error upset events. The memory elements can be used in any suitable integrated circuits that use memory. These integrated circuits may be memory chips, digital signal processing circuits with memory arrays, microprocessors, application specific integrated circuits with memory arrays, programmable integrated circuits such as programmable logic device integrated circuits in which memory elements are used for configuration memory, or any other suitable integrated circuit.

On integrated circuits such as memory chips or other circuits in which memory is needed to store processing data, the memory elements may be volatile memory elements (e.g., random-access memory cells such as static random-access memory cells), nonvolatile memory elements (e.g., relay devices, fuses, antifuses, electrically-programmable read-only memory elements, etc.), or other types of memory elements. In the context of programmable integrated circuits, the memory elements can be used to store configuration data and are therefore sometimes referred to in this context as configuration memory cells.

Figure 1:
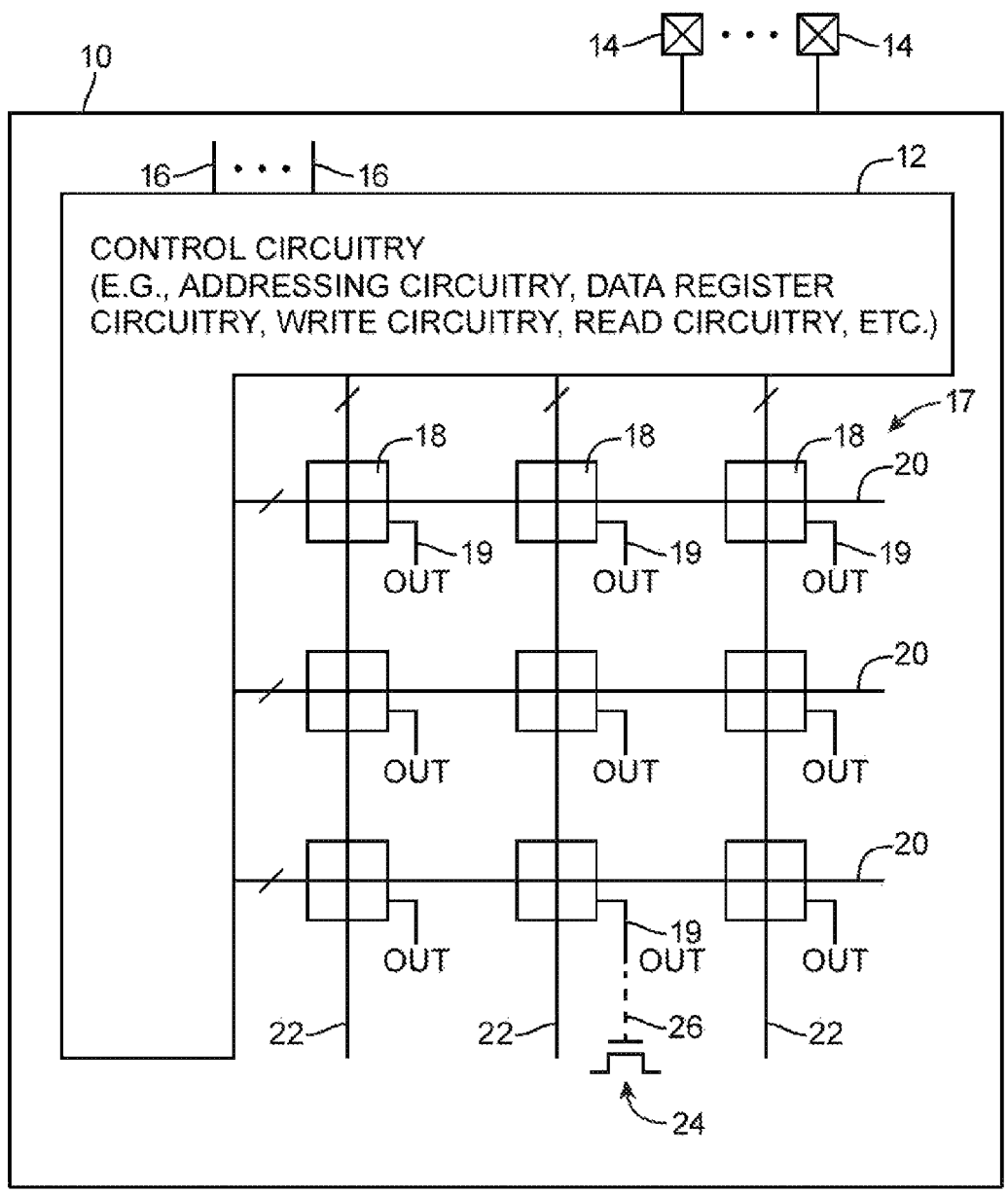
FIG. 1 is a diagram of illustrative memory array circuitry in accordance with an embodiment of the present invention.

FIG. 1 shows an integrated circuit that may include an array of memory cells 18. Any suitable memory array architecture may be used for memory cells 18. One suitable arrangement is shown in FIG. 1. There are only three rows and columns of memory cells 18 in the illustrative array of FIG. 1, but in general there may be hundreds or thousands of rows and columns in memory array 17. Array 17 may be one of a number of arrays on a given device 10, may be a subarray that is part of a larger array, or may be any other suitable group of memory cells 18.

Each memory element may supply a corresponding output signal OUT at a corresponding output path 19. In configuration memory arrays, each signal OUT is a static output control signal that may be conveyed over a corresponding path 26 and may be used in configuring a corresponding transistor such as transistor 24 or other circuit element in an associated programmable logic circuit.

Integrated circuit 10 may have control circuitry 12 for supplying signals to memory array 17. Control circuitry 12 may receive power supply voltages, data, and other signals from external sources using pins 14 and from internal sources using paths such as paths 16. Control circuitry 12 may include circuitry such as addressing circuitry, data register circuitry, write circuitry, read circuitry, etc. Control circuitry 12 may use the power supply voltages supplied by pins 14 to produce desired time-varying and fixed signals on paths such as paths 20 and 22.

The signals that are supplied to memory elements 18 may sometimes be collectively referred to as control signals. In particular contexts, some of these signals may be referred to as power signals, clear signals, data signals, address signals, etc. These different signal types are not mutually exclusive. For example, a clear signal for array 17 may serve as a type of control (address) signal that can be used to clear array 17. This clear signal may also serve as a type of power signal by powering inverter-like circuitry in cells 18. Likewise, because clearing operations serve to place logic zeros in memory cells 18, clear signals may serve as a type of data signal.

There may, in general, be any suitable number of conductive lines associated with paths 20 and 22. For example, each row of array 17 may have associated address lines (e.g., a true address line and a complement address line) and associated read/write enable lines in a respective one of paths 20 (as examples). Each column of array 17 may have a respective path 22 that includes data lines. The terms "rows" and "columns" merely represent one way of referring to particular groups of cells 18 in memory array 17 and may sometimes be used interchangeably. If desired, other patterns of lines may be used in paths 20 and 22. For example, different numbers of power supply signals, data signals, and address signals may be used.

A clear signal may be routed to all of the cells in array 17 simultaneously over a common clear line. The clear line may be oriented vertically so that there is one branch of the clear line in each path 22 or may be oriented horizontally so that there is one branch of the clear line in each path 20. The clear line need not be necessary.

Power can also be distributed in this type of global fashion. For example, a positive power supply voltage Vcc may be supplied in parallel to each cell 18 using a pattern of shared horizontal or vertical conductors. A ground voltage Vss may likewise be supplied in parallel to cells 18 using a pattern of shared horizontal or vertical lines. Control lines such as address lines and data lines are typically orthogonal to each other (e.g., address lines are vertical while data lines are horizontal or vice versa).

Positive power supply voltage Vcc may be provided over a positive power supply line. Ground voltage Vss may be provided over a ground power supply line. Any suitable values may be used for positive power supply voltage Vcc and ground voltage Vss. For example, positive power supply voltage Vcc may be 1.2 volts, 1.1 volts, 1.0 volts, 0.9 volts, less than 0.9 volts, or any other suitable voltage. Ground voltage Vss may be zero volts (as an example). In a typical arrangement, power supply voltages Vcc may be 1.0 volts, Vss may be zero volts, and the signal levels for address, data, and clear signals may range from zero volts (when low) to 1.0 volts (when high). Arrangements in which Vcc varies as a function of time, in which Vss is less than zero volts, and in which control signals are overdriven (i.e., in which control signals have signal strengths larger than Vcc-Vss) may also be used.

Figure 2:
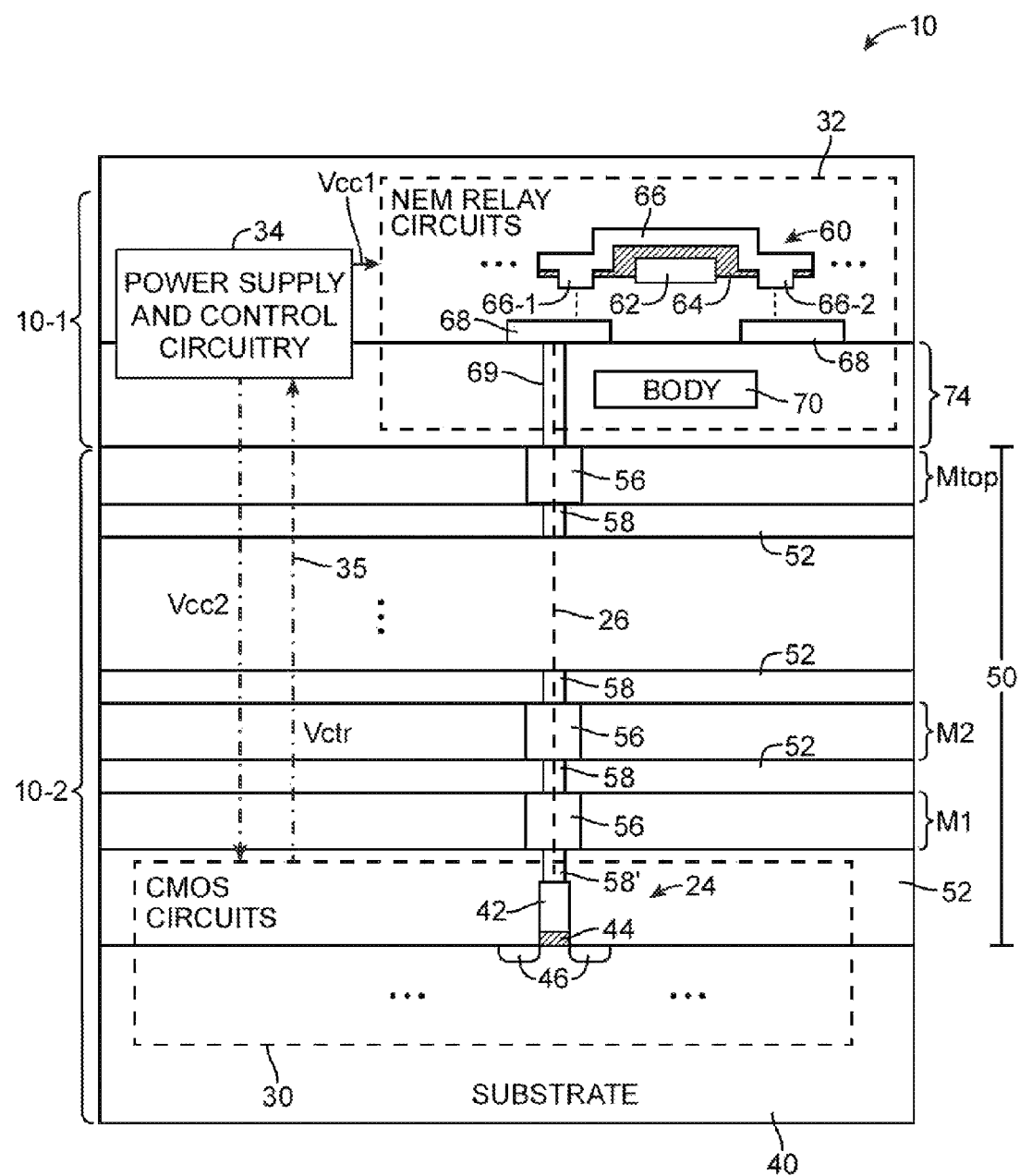
FIG. 2 is a cross-sectional side view of an integrated circuit having circuitry formed using complementary metal-oxide-semiconductor (CMOS) technology and nano-electromechanical (NEM) relay technology in accordance with an embodiment of the present invention.

FIG. 2 is a cross-sectional side view of integrated circuit 10 having circuitry 10-1 of a first type formed on top of circuitry 10-2 of a second type. As shown in FIG. 2, circuitry 10-1 may include mechanical circuitry such as nano-electromechanical (NEM) relay circuits 32, whereas circuitry 10-2 may include complementary metal-oxide-semiconductor (CMOS) circuits 30 and associated dielectric stack 50.

CMOS circuits 30 may, for example, include metal-oxide-semiconductor field-effect transistors (MOSFETs) such as n-channel metal-oxide-semiconductor (NMOS) transistors and p-channel metal-oxide-semiconductor (PMOS) transistors formed in a semiconductor substrate 40, structures such as shallow trench isolation (STI) structures for separating one transistor from another in substrate 40, polysilicon resistors, and other types of electrical devices that can be formed using CMOS technology. Dielectric stack 50 may be formed over the surface of substrate 40. Dielectric stack 50 may include layers of silicon oxide or other dielectrics within which conductive structures are formed. Dielectric stack 50 may include metal interconnect layers (sometimes referred to as metal layers or metal routing layers) and via layers 52.

Conductive routing lines (sometimes referred to as metal interconnect paths) may be formed in the metal routing layers. Via layers 52 may contain vertical conducting structures (e.g., conductive vias such as tungsten vias, copper vias, aluminum vias, or other metal vias) configured to connect the conductive routing lines formed at opposing ends of each conductive via. The metal routing layer closest to substrate 40 may be referred to as first metal routing layer M1. Successive metal routing layers may include metal routing layers M2, M3, . . . , Mtop in that order, where metal routing layer M2 is closest to layer M1 and metal routing layer Mtop is furthest away from layer M1 (i.e., metal routing layer M1 represents a bottom layer in the dielectric stack, whereas metal routing layer Mtop represent a top layer in the dielectric stack). Dielectric stack 50 may be configured in an alternating arrangement in which each adjacent pair of metal routing layers are separated by a via layer 52.

Circuits 32 may include NEM relay switches such as relay switch 60, nonvolatile devices, and other types of electromechanical devices that can be formed using NEM fabrication technology. Relay switch 60 may be an electrostatically actuated mechanical switch whose state depends on voltage levels applied at its terminals. Switch 60 may, for example, include first and second source-drain terminals 68 formed on the surface of a layer of dielectric 74 (sometimes referred to as body dielectric material). A conductive bridge member 66, sometimes referred to as a metal channel, may have a first protruding portion 66-1 extending over the first source-drain terminal and a second protruding portion 66-2 extending over the second source drain terminal. Bridge member 66 may be supported by a gate member 62 (e.g., a polysilicon gate structure or a metal gate structure). Bridge member 66 and gate member 62 may be separated by dielectric material 64. Gate member 62 may serve as a beam that is suspended over a channel region located between associated first and second source-drain regions 68. Gate member 62 may be attached to dielectric 74 via an anchoring structure (not shown) located outside of the channel region. A conductive body electrode 70 may be formed within the surface of dielectric 74 below gate member 62.

The state of relay switch 60 may be controlled by applying appropriate voltages to gate 62 and body 70. As an example, if the voltage difference between the gate and body terminals of switch 60 is greater than a predetermined voltage threshold level, switch 60 may be placed in an on state (i.e., beam 62 may be lowered to connect the source-drain terminals by place portions 66-1 and 66-2 in contact with first and second source-drain terminals 68). If the voltage difference between the gate and body terminals of switch 60 is less than the predetermined voltage threshold level, switch 60 may be placed in an off state (i.e., beam 62 may be raised so that first and second source-drain terminals 68 are not in contact with portions 66-1 and 66-2). When switch 60 is placed in the off state, bridge member 66 and source-drain structures 68 may be separated by air (as an example).

In one suitable arrangement of the present invention, memory array 17, memory addressing circuitry, memory data register circuitry, memory write driver circuitry, memory read circuitry, and other peripheral memory control circuitry may be formed in portion 10-1, whereas configurable logic circuits such as pass transistors 24, passive integrated circuit components (e.g., integrated circuit resistors, capacitors, and inductors), digital and analog processing units, and other non-memory related circuitry may be formed in portion 10-2 (e.g., portion 10-1 may be formed on top of portion 10-2).

Consider the example of FIG. 2 in which relay switch 60 in upper portion 10-1 forms part of a configuration memory cell 18. The first source drain region 68 of switch 60 may serve as output 19 on which static control signal OUT is provided (see, e.g., FIG. 1). The static control signal OUT may be fed to a corresponding pass transistor 24 formed in lower portion 10-2. As shown in FIG. 2, pass transistor 24 includes source-drain regions 46 formed in substrate 40, a gate 42 formed over a channel region located between source-drain regions 46, and a gate insulating layer 44 interposed between gate 42 and the associated channel region.

Switch 60 in upper portion 10-1 may be coupled to corresponding pass transistor 24 through path 26. As shown in FIG. 2, first source-drain terminal 68 of switch 60 may be coupled to transistor 24 through via 69 formed in dielectric layer 74, through metal stubs 56 formed in metal layers M1-Mtop, through metal vias 58 connecting metal stubs 56, and through metal via 58' connecting metal stub 56 in metal routing layer M1 to gate 42. This example is merely illustrative and is not intended to limit the scope of the present invention. If desired, other electrical connections between circuitry in portion 10-1 and 10-2 can be made in this way. For example, processing circuitry 30 formed in portion 10-2 may be configured to send control signals Vctr to circuitry 34 in portion 10-1 over path 35 through dielectric stack 50 (e.g., to control the mechanical relay memory elements).

Forming memory circuitry in portion 10-1 directly above other CMOS circuitry in portion 10-2 may substantially conserve valuable integrated circuit real estate, because memory circuitry no longer needs to be formed on the same plane as the logic and other processing circuitry. In another suitable arrangement of the present invention, circuitry 10-1 may include power supply and control circuitry 34 operable to provide a first positive power supply voltage Vcc1 to NEM relay circuits 32 and a second positive power supply voltage Vcc2 to CMOS circuits 30. Circuitry 34 may be formed using NEM devices. Power domain separation provided using this arrangement may allow memory circuitry operating in portion 10-1 to be overdriven for increased performance while reducing power consumption for the circuitry operating in portion 10-2. For example, power supply and control circuitry 34 may supply 1.2 volts for powering the memory circuitry in upper portion 10-1 and 0.85 volts for powering circuits 30 in lower portion 10-2.

Figure 3:
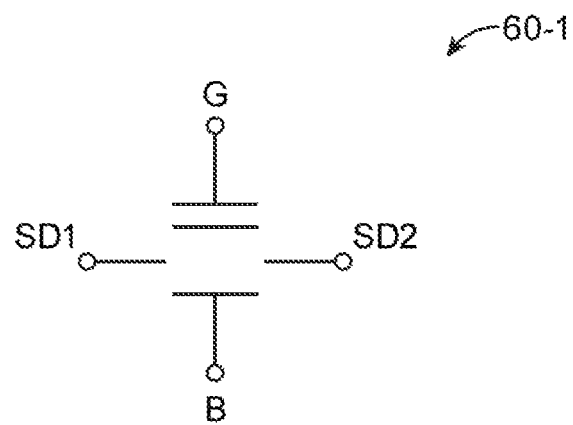
FIG. 3 is a diagram of a nonvolatile relay switch in accordance with an embodiment of the present invention.

FIG. 3 is a schematic diagram of a first type of relay switch 60-1. As shown in FIG. 3, relay switch 60-1 may have source-drain terminals SD1 and SD2, gate terminal G, and body (or bulk) terminal B. Relay switch 60-1 may exhibit nonvolatile behavior in which the state of switch 60-1 is preserved even if its gate and body terminals are not supplied with any power.

Figure 4:
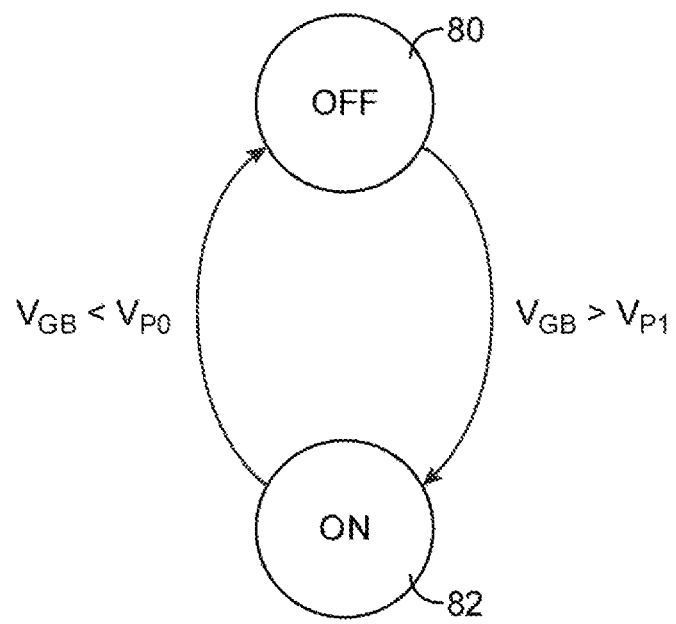
FIG. 4 is a state diagram of the relay switch of FIG. 3 in accordance with an embodiment of the present invention.

FIG. 4 is a state diagram illustrating the operation of nonvolatile relay switch 60-1. If switch 60-1 is in off state 80 (i.e., a state in which SD1 and SD2 are disconnected), switch 60-1 may be turned on by biasing terminals G and B such that the voltage difference ($V_{GB}$) between terminals G and B exceeds a predetermined pull-in voltage threshold $V_{PI}$. If switch 60-1 is in on state 82 (i.e., a state in which SD1 and SD2 are electrically and mechanically connected through bridge member 66), switch 60-2 may be turned off by biasing terminals G and B such that VGB is less than a predetermined pull-out voltage threshold $V_{PO}$. Switch 60-1 may remain in the off state 80 until the pull-in criterion is satisfied (regardless whether $V_{GB}$ is less than $V_{PO}$). Similarly, switch 60-2 may remain in the on state 82 until the pull-out condition is satisfied (regardless whether $V_{GB}$ is greater than $V_{PI}$). Threshold $V_{PI}$ may have a positive value, whereas $V_{PO}$ may have a negative value (as an example).

For example consider a scenario in which device 10 is powered on and switch 60-1 is initially in the off state. Control circuitry may be used to bias switch 60-1 such that $V_{GB}$ exceeds $V_{PI}$ to place switch 60-1 in the on state. Device 10 may then be powered off. Upon powering up device 10 once again, switch 60-1 may remain in the on state. Consider another scenario in which device 10 is powered on and switch 60-1 is initially in the on state. Control circuitry may be used to bias switch 60-1 such that $V_{GB}$ is less than $V_{PO}$ to place switch 60-1 in the off state. Device 10 may then be powered off. Upon powering up device 10 once again, switch 60-1 may remain in the off state. Relay switch 60-1 having such operational characteristics may be used to form a nonvolatile memory element.

Figure 5:
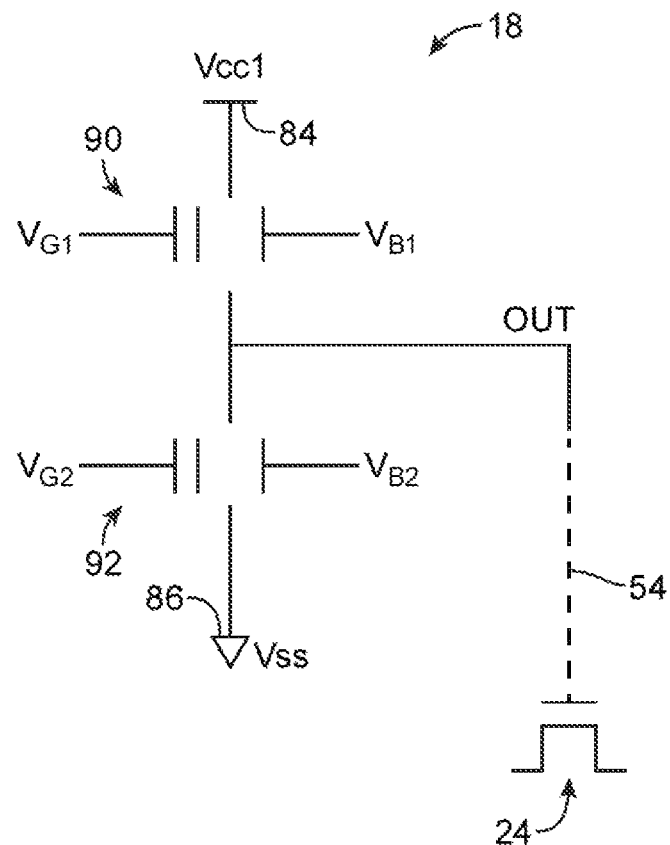
FIG. 5 is a circuit diagram of an illustrative memory cell formed using relay switches of the type shown in connection with FIGS. 3 and 4 in accordance with an embodiment of the present invention.

FIG. 5 is a circuit diagram of an exemplary nonvolatile memory cell 18. As shown in FIG. 5, relay switches 90 and 92 may be coupled in series through their source-train terminals between a positive power supply line (e.g., a power supply line on which positive power supply voltage Vcc1 is provided) and a ground power supply line 86 (e.g., a ground line on which ground power supply voltage Vss is provided). Switches 90 and 92 may be nonvolatile relay switches of the type described in connection with FIGS. 3 and 4. The state of switch 90 may be controlled by the relative magnitude of voltages $V_{G1}$ and $V_{B1}$, whereas the state of switch 92 may be controlled by the relative magnitude of voltages $V_{G2}$ and $V_{B2}$. Circuitry 34 described in connection with FIG. 2 may be used to control these voltages for switches 90 and 92 in memory cell 18. Switches 90 and 92 may be serially connection at an intermediate node on which static output control signal OUT is provided.

Cell 18 of FIG. 5 may be a nonvolatile memory cell (i.e., a memory cell that retains its state regardless if device 10 is supplied with power). For example consider a scenario in which device 10 is powered on and a given cell 18 is initially storing a "1" (i.e., signal OUT is high). Control circuitry may be used to turn off switch 90 and turn on switch 92 to write a "0" into the given cell. Device 10 may then be powered off. Upon powering up device 10 once again, the given cell will remain storing a "0" (i.e., switches 90 and 92 will retain their states even they are not supplied with any voltage). Consider another scenario in which device 10 is powered on and the given cell is initially storing a "0" (i.e., signal OUT is low). Control circuitry may be used to turn on switch 90 and turn off switch 92 to write a "1" into the given cell. Gate-to-bulk voltages $V_{GB1}$ and $V_{GB2}$ may be equal to zero volts during normal operation of device 10. The given cell will remain storing a "1" even if $V_{GB1}$ is less than $V_{PI}$ and if $V_{GB2}$ is greater than $V_{PO}$ (i.e., switches 90 and 92 will retain their states as long as the pull-in/pull-out conditions are not met).

Memory cell 18 of this type may also exhibit soft error upset immunity, because high-energy cosmic rays striking the intermediate output node does not affect the gate and bulk terminals. Even if an alpha particle were to strike one of the gate and bulk terminals, it is highly unlikely that this event will be able to drive $V_{GB}$ such that the pull-in condition or the pull-out condition is satisfied to flip the state of one switches 90 and 92 in cell 18.

FIG. 6 is a table of illustrative voltage biasing values for operating memory cell 18 of FIG. 5. To write a "1" into the cell, $V_{G1}$ and $V_{B1}$ may be respectively driven to 1.0 volts and −1.0 volts to turn on pull-up relay switch 90, whereas $V_{G2}$ and $V_{B2}$ may be respectively driven to −1.0 volts and 1.0 volts to turn off pull-down relay switch 92. In this example, $V_{PI}$ is equal to 1.5 volts and $V_{PO}$ is equal to −1.5 volts. Switch 90 will stay closed until the pull-out requirement is satisfied (i.e., until $V_{GB}$ is less than $V_{PO}$). Similarly, switch 92 will stay open until the pull-in threshold is met (i.e., until $V_{GB}$ is greater than $V_{PI}$).

To write a "0" into the cell, $V_{G1}$ and $V_{B1}$ may be respectively driven to −1.0 volts and 1.0 volts to turn off pull-up relay switch 90 ($V_{GB}$ is less than $V_{PO}$), whereas $V_{G2}$ and $V_{B2}$ may be respectively driven to 1.0 volts and −1.0 volts to turn on pull-down relay switch 92 ($V_{GB}$ is greater than $V_{PI}$). Switch 90 will stay open until the pull-in requirement is satisfied (i.e., until $V_{GB}$ is greater than $V_{PI}$), and switch 92 will stay closed until the pull-out threshold is met (i.e., until $V_{GB}$ is less than $V_{PO}$). In general, the state of cell 18 may remain unchanged until a "1" or load "0" condition is met. For example, $V_{G1}$, $V_{B1}$, $V_{G2}$, and $V_{B2}$ may be grounded during normal operation of cell 18 (e.g., $V_{G1}$, $V_{B1}$, $V_{G2}$, and $V_{B2}$ are driven to zero volts, and cell 18 holds its current state).

Figure 7:
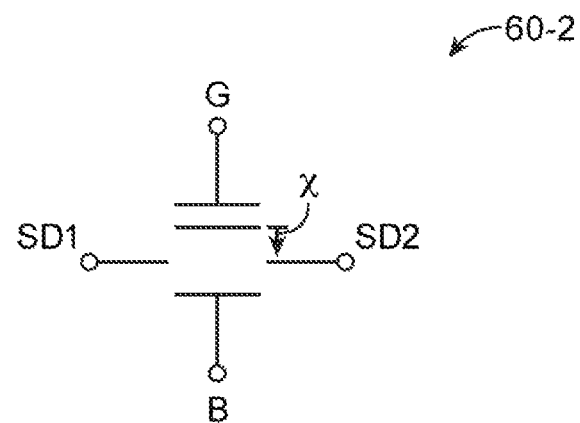
FIG. 7 is a diagram of a volatile relay switch in accordance with an embodiment of the present invention.

FIG. 7 is a schematic diagram of a second type of relay switch 60-2. As shown in FIG. 7, relay switch 60-2 may have source-drain terminals SD1 and SD2, gate terminal G, and body (or bulk) terminal B. Relay switch 60-2 may exhibit volatile behavior in which the state of switch 60-2 is lost if its gate and body terminals are not supplied with power. The amount by which the gate member of switch 60-2 is flexed towards the source-drain conductors is defined as beam displacement X.

Figure 8:
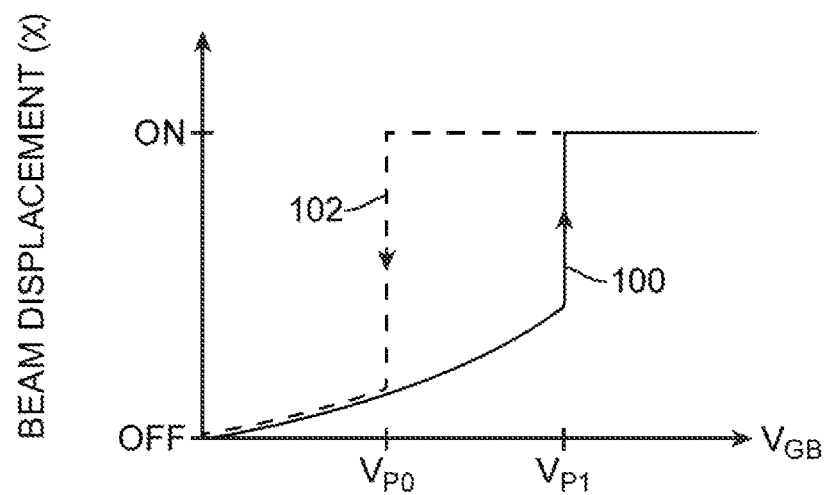
FIG. 8 is a graph of beam displacement versus gate-to-bulk voltage illustrating the operation of the relay switch of FIG. 7 in accordance with an embodiment of the present invention.

FIG. 8 is a plot of beam displacement versus gate-to-bulk voltage $V_{GB}$. As shown in FIG. 8, beam displacement X is minimal when $V_{GB}$ is less than pull-out threshold $V_{PO}$ (i.e., switch 60-2 will be turned off when $V_{GB}$ is less than $V_{PO}$). Beam displacement is maximized when $V_{GB}$ is greater than pull-in threshold VPI (i.e., switch 60-2 will be turned on when $V_{GB}$ is greater than $V_{PI}$). Switch 60-2 may exhibit a hysteresis behavior in which the on/off voltage transitions are different (e.g., the on/off transition requirements depend on the current state of switch 60-2).

For example, consider a scenario in which switch 60-2 is initially in the off state. If $V_{GB}$ is gradually increased, beam displacement X will increase. Switch 60-2 will be placed in the on state when $V_{GB}$ exceeds $V_{PI}$ (see, transition 100). If $V_{GB}$ is then gradually decreased, switch 60-2 will remain in the on state even if $V_{GB}$ falls below $V_{PI}$ (as long as $V_{GB}$ is still greater than $V_{PO}$). Once $V_{GB}$ is lowered below $V_{PO}$, switch 60-2 will be turned off (see, transition 102). In this example, $V_{PI}$ is greater than $V_{PO}$. FIG. 8 is merely illustrative and is not intended to limit the scope of the invention. If desired, $V_{PI}$ may be equal to $V_{PO}$ or less than $V_{PO}$.

Figure 9:
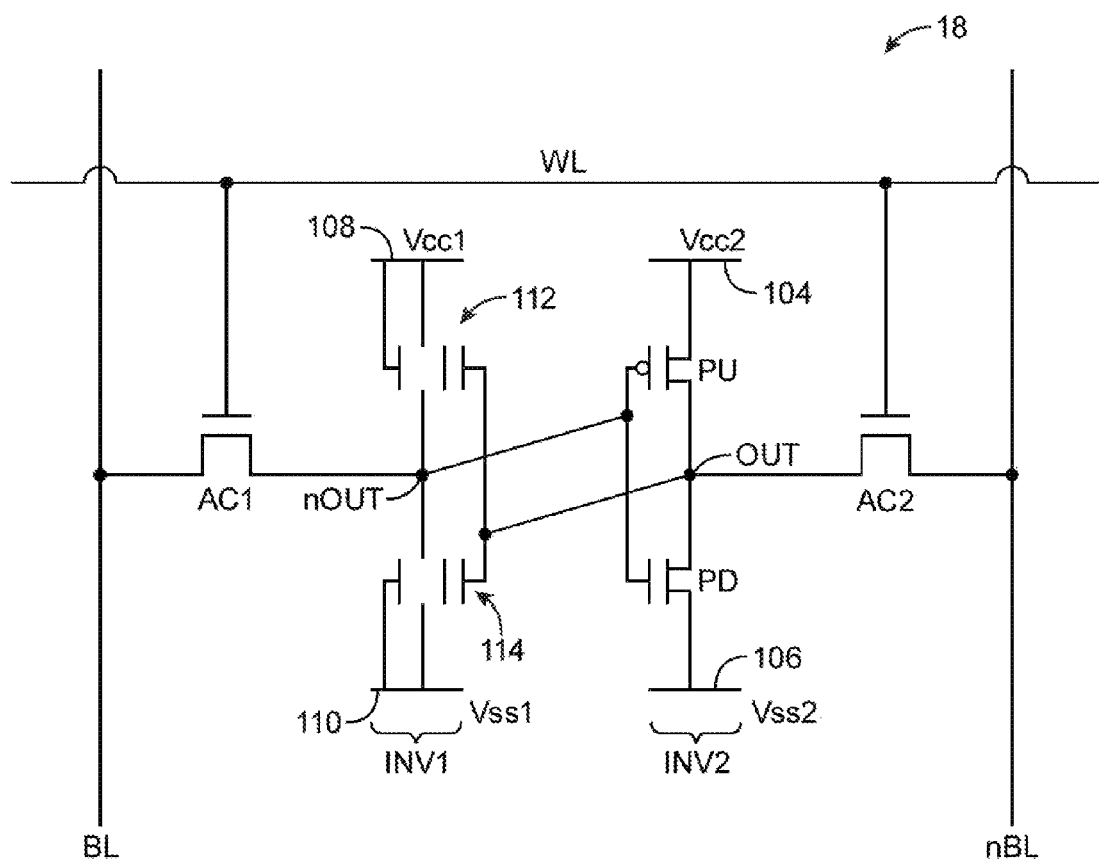
FIG. 9 is a circuit diagram of an illustrative memory cell formed using relay switches of the type shown in connection with FIGS. 7 and 8 in accordance with an embodiment of the present invention.

FIG. 9 is a circuit diagram of a memory cell 18 that includes CMOS transistors and NEM relay switches in accordance with one embodiment of the present invention. As shown in FIG. 9, cell 18 may include first and second cross-coupled inverting circuits INV1 and INV2. Inverting circuit INV1 may include relay switches 112 and 114 coupled in series between a first positive power supply line 108 (e.g., a power supply line on which positive power supply voltage Vcc1 is provided) and a first ground line 110 (e.g., a power supply line on which ground power supply voltage Vss1 is provided). Switches 112 and 114 may be volatile relay switches 60-2 of the typed described in connection with FIGS. 7 and 8. The bulk terminal of switch 112 may be coupled to power supply line 108, whereas the bulk terminal of switch 110 may be coupled to power supply line 110.

Inverting circuit INV2 may include p-channel pull-up transistor PU (e.g., a p-channel metal-oxide-semiconductor device) and n-channel pull-down transistor PD (e.g., an n-channel metal-oxide-semiconductor device) coupled in series between a second positive power supply line 104 (e.g., a power supply line on which positive power supply voltage Vcc2 is provided) and a second ground line 106 (e.g., a power supply line on which ground power supply voltage Vss2 is provided). In this example, Vcc1/Vss1 associated with relay switches 112 and 114 may be equal or different in magnitude than Vcc2/Vss2 associated with CMOS transistors PU and PD (i.e., the relay devices and the CMOS devices are powered using separate power supply lines).

Inverting circuits INV1 and INV2 may each have an input and an output. The output of INV1 may be coupled to the input of INV2 and may serve as a first data storage node nOUT for memory cell 18. The output of INV2 may be coupled to the input of INV1 and may serve as a second data storage node OUT for memory cell 18. Inverting circuits INV1 and INV2 cross-coupled in this way may be used as a latch to store true and complement versions of a single data bit at data storage nodes nOUT and OUT, respectively. For example, cell 18 may be used to store a "0" (i.e., node OUT is low and node nOUT is high) or may be used to store a "1" (i.e., node OUT is high and node nOUT is low). This cross-coupled portion of cell 18 may therefore sometimes be referred to as a bistable memory element.

A first access transistor such as transistor AC1 may be coupled between data storage node nOUT and a first data line (e.g., a data line on which true bit line signal BL is provided). A second access transistor such as transistor AC2 may be coupled between data storage node OUT and a second data line (e.g., a data line on which complement bit line signal nBL is provided). The gates of transistors AC1 and AC2 may be controlled using a corresponding word line signal WL. The access transistors may be used to read data from and write data into memory cell 18 (e.g., by asserting WL and biasing the bit line signals to appropriate voltage levels). Word line signal WL may sometimes be referred to as an address signal, whereas transistors AC1 and AC2 may sometimes be referred to as address transistors.

Relay switches 112 and 114 in cell 18 of FIG. 9 may be formed in upper device portion 10-1 (see, e.g., FIG. 2), whereas transistors PU, PD, AC1, and AC2 are formed in lower device portion 10-2. The input and output of relay inverter circuit INV1 may be coupled down to transistor AC1 and CMOS inverter circuit INV2 through via paths 26 in dielectric stack 50.

Figure 10:
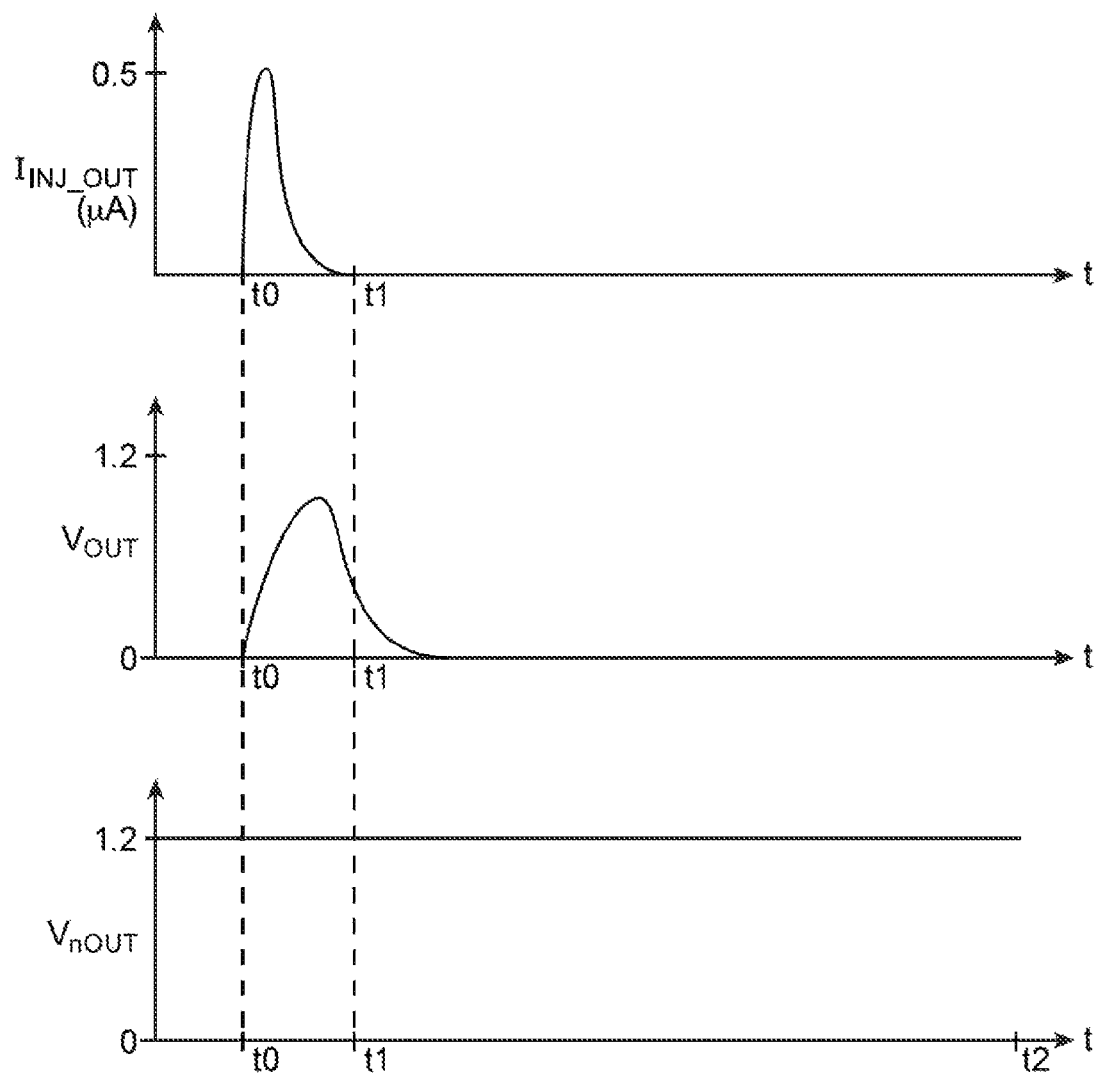
FIG. 10 is a timing diagram showing how the memory cell of FIG. 9 is immune to soft error upsets in accordance with an embodiment of the present invention.

Because the mechanical switching delay of relay devices tend to be much longer in duration than the amount of time that a cell is under disturbance caused by high-energy cosmic rays, memory cell 18 of the type described in connection with FIG. 9 exhibits soft error upset immunity. Consider, for example, a scenario in which cell 18 is storing a "0" and an impinging alpha particle strikes output node OUT at time t0 (see, e.g., the timing diagram of FIG. 10). This event may result in a pulse of current $I_{INJ\_OUT}$ being injected at node OUT (e.g., a current pulse peaking at 0.5 µA) and may cause the voltage at node OUT ($V_{OUT}$) to rise towards positive power supply voltage of 1.2 volts (as an example). This temporary rise in $V_{OUT}$ may initiate turning on switch 114 and turning off switch 112. However, because the amount of time it takes for the gate members of switches 112 and 114 to pull in or pull out (e.g., time t0 to t2) is on the order of nanoseconds whereas the duration of the injected noise current (e.g., time t0 to t1) is on the order of picoseconds, node nOUT will remain high at t1. After time t1, transistor PD is on and will serve to discharge $V_{OUT}$ back towards ground (i.e., cell 18 retains its stored value of "0").

Figure 11:
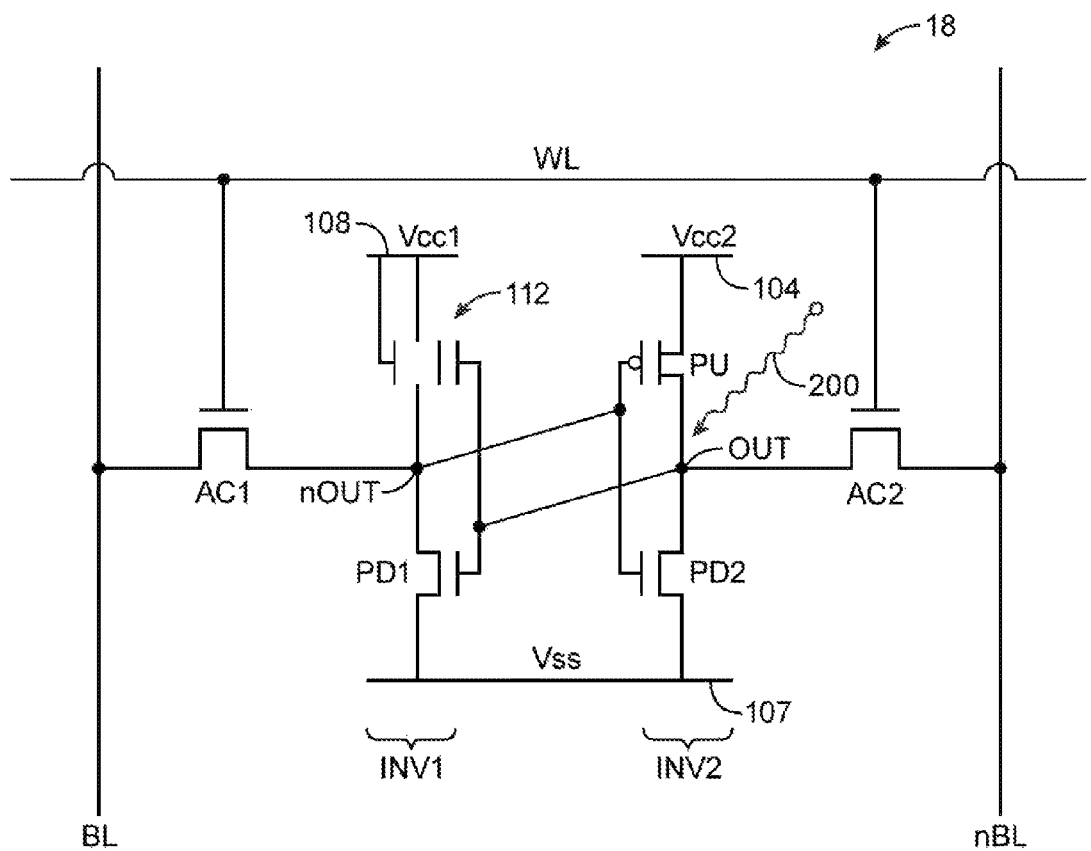
FIG. 11 is a circuit diagram of an illustrative memory cell formed using at least one relay switch of the type shown in connection with FIGS. 7 and 8 in accordance with an embodiment of the present invention.

FIG. 11 shows another suitable arrangement of memory cell 18 in accordance with an embodiment of the present invention. As shown in FIG. 11, cell 18 may include first and second cross-coupled inverting circuits INV1 and INV2. Inverting circuit INV1 may include relay switch 112 and n-channel transistor PD1 coupled in series between first positive power supply line 108 and a common ground line 107 (e.g., a power supply line on which ground voltage Vss is provided). Switch 112 may be relay switch 60-2 of the type described in connection with FIGS. 7 and 8. The bulk terminal of switch 112 may be coupled to power supply line 108.

Inverting circuit INV2 may include p-channel transistor PU and n-channel transistor PD2 coupled in series between second positive power supply line 104 and common ground line 107. In this example, Vcc1 associated with INV1 may be equal or different in magnitude than Vcc2 associated with INV2, but Vss may be supplied to both INV1 and INV2. If desired, INV1 and INV2 may receive different ground voltage signals from respective ground power supply lines.

Inverting circuits INV1 and INV2 may each have an input and an output. The output of INV1 may be coupled to the input of INV2 and may serve as a first data storage node nOUT for memory cell 18. The output of INV2 may be coupled to the input of INV1 and may serve as a second data storage node OUT for memory cell 18. First access transistor AC1 may be coupled between data storage node nOUT and a first data line, whereas second access transistor AC2 may be coupled between data storage node OUT and a second data line. The gates of transistors AC1 and AC2 may be controlled using corresponding word line signal WL. The access transistors may be used to read data from and write data into memory cell 18.

Relay switch 112 in cell 18 of FIG. 11 may be formed in upper device portion 10-1 (see, e.g., FIG. 1), whereas transistors PD1, PD2, PU, AC1, and AC2 are formed in lower device portion 10-2 using standard CMOS fabrication techniques. Relay switch 112 may be coupled down to transistor AC1, PD1, and CMOS inverter circuit INV2 through via paths 26 in dielectric stack 50.

Memory cell 18 of the type described in connection with FIG. 11 may also be used to exhibit soft error upset immunity. Consider, for example, a scenario in which cell 18 is storing a "0" and an impinging alpha particle strikes output node OUT (as indicated by arrow 200). This will cause $V_{OUT}$ to rise high and turn on transistor PD1. Switch 112 remains on for the duration that $V_{OUT}$ is high because mechanical switching of relay devices is relatively slow compared to the electrical switching of CMOS transistors. When both switch 112 and transistor PD1 are on, $V_{nOUT}$ will stay relatively high (e.g., greater than 50% of Vcc1) because the on resistance of switch 112 is substantially lower than the on resistance of transistor PD1 (i.e., the mechanical conductance of relay devices is substantially higher than the electrical conductance of CMOS transistors). As a result, when the effect of particle 200 dissipates, the high voltage on node nOUT enables transistor PD2 to discharge node OUT back towards ground.

Consider another scenario in which cell 18 is storing a "1" and impinging alpha particle 200 strikes output node OUT to cause $V_{OUT}$ to fall low and turn off transistor PD1. Switch 112 remains off for the duration that $V_{OUT}$ is low because of its slow mechanical switching. When both switch 112 and transistor PD1 are off, node nOUT will be floating and $V_{nOUT}$ will therefore stay low. As a result, when the effect of particle 200 dissipates, the low voltage on node nOUT enables transistor PPU to charge OUT back towards Vcc2.

The memory cell configurations of FIGS. 9 and 11 are merely illustrative and are not intended to limit the scope of the present invention. If desired, relay switches may be used in memory cells having less than six switching devices or more than six switching devices, in multiport memory cells, in memory cells with read buffer circuits, in memory cells having more than two cross-coupled inverting circuits, and in other types of memory elements. Memory cells that include relay devices may also exhibit reduced power consumption, because NEM relay devices exhibit substantially less source-drain leakage current relative to CMOS transistors.

The foregoing is merely illustrative of the principles of this invention and various modifications can be made by those skilled in the art without departing from the scope and spirit of the invention. The foregoing embodiments may be implemented individually or in any combination.

What is claimed is:
1. An integrated circuit comprising:
circuitry formed in a substrate;

mechanical relay memory circuits formed in a body dielectric layer on top of the circuitry, wherein at least some of the mechanical relay memory circuits are coupled to the circuitry; and a dielectric stack interposed between the substrate and the body dielectric layer.

2. The integrated circuit defined in claim 1, wherein the dielectric stack comprises a plurality of metal routing layers and via layers.

3. The integrated circuit defined in claim 1, wherein the circuitry comprises complementary metal-oxide-semiconductor circuitry.

4. The integrated circuit defined in claim 1, wherein the circuitry is operable to generate control signals for the mechanical relay memory circuits.

5. The integrated circuit defined in claim 4, wherein at least one of the mechanical relay memory circuits includes a pair of mechanical relay switches coupled in series between a pair of power supply lines having different voltage levels.

6. The integrated circuit defined in claim 5, wherein the pair of mechanical relay switches comprises a pair of non-volatile mechanical relay switches.

7. The integrated circuit defined in claim 4, wherein the mechanical relay memory circuits include at least one mechanical relay switch, and wherein the circuitry includes an inverter that is coupled to the at least one mechanical relay switch to form a bistable memory element.

8. The integrated circuit defined in claim 7, wherein the at least one mechanical relay switch comprises a volatile mechanical relay switch.

9. The integrated circuit defined in claim 1 wherein the integrated circuit comprises a programmable integrated circuit operable to receive configuration data from a user and wherein the mechanical relay memory circuits are operable to store the configuration data.

10. A memory element comprising:
a first inverting circuit having at least an n-channel transistor and a p-channel transistor coupled in series; and
a second inverting circuit having at least one mechanical relay switch, wherein the first and second inverting circuits are cross-coupled together, and wherein the second inverting circuit further includes a circuit that is coupled in series with the at least one mechanical relay switch.

11. The memory element defined in claim 10, wherein the circuit comprises a mechanical relay switch.

12. The memory element defined in claim 10, wherein the circuit comprises a metal-oxide-semiconductor transistor.

13. The memory element defined in claim 12, wherein the circuit comprises an n-channel transistor.

14. The memory element defined in claim 13 further comprising:
a data line; and
at least one access transistor coupled between the data line and the first inverting circuit.

15. A memory element comprising:
a first inverting circuit having a p-channel transistor coupled to a first power supply line operable to supply a first power supply voltage; and a second inverting circuit having at least one mechanical relay switch coupled to a second power supply line that is different than the first power supply line and that is operable to supply a second power supply voltage that is different than the first power supply voltage, wherein the first inverting circuit is coupled to the second inverting circuit.

16. The memory element defined in claim 15 further comprising:
a third power supply line; and
a first n-channel transistor coupled in series with the p-channel transistor between the first and third power supply line.

17. The memory element defined in claim 16, wherein the second inverting circuit further includes a second n-channel transistor coupled in series with the at least one mechanical relay switch between the second and third power supply lines.

18. The memory element defined in claim 16 further comprising a fourth power supply line, wherein the second inverting circuit further includes an additional mechanical relay switch coupled in series with the at least one mechanical relay switch between the second and fourth power supply lines, and wherein the third and fourth power supply lines are operable to supply different power supply voltages.

19. A programmable integrated circuit comprising:
a bistable memory element having a first inverter that includes an n-channel transistor and a mechanical relay switch and a second inverter that is cross-coupled with the first inverter, wherein the bistable memory element has an output on which a static control signal is provided.

20. The programmable integrated circuit defined in claim 19 further comprising:
a pass transistor having a gate operable to receive the static control signal, wherein the pass transistor forms part of programmable logic circuitry on the programmable integrated circuit.

21. A programmable integrated circuit comprising:
a bistable memory element that includes at least one n-channel transistor and at least one mechanical relay switch, wherein the bistable memory element has an output on which a static control signal is provided;
a p-channel transistor that is coupled in series with the at least one n-channel transistor; and
an additional mechanical relay switch that is coupled in series with the at least one mechanical relay switch.

22. A programmable integrated circuit comprising:
a bistable memory element that includes at least one n-channel transistor and at least one mechanical relay switch, wherein the bistable memory element has an output on which a static control signal is provided;
a substrate;
a dielectric layer; and
at least one metal routing layer interposed between the substrate and the dielectric layer, wherein the n-channel transistor is formed in the substrate and wherein the mechanical relay switch is formed in the dielectric layer.

* * * * *